(12) United States Patent
Lai et al.

(10) Patent No.: US 10,163,648 B2
(45) Date of Patent: Dec. 25, 2018

(54) METHOD OF SEMICONDUCTOR DEVICE FABRICATION HAVING APPLICATION OF MATERIAL WITH CROSS-LINKABLE COMPONENT

(71) Applicant: Taiwan Semiconductor Manufacturing Co., Ltd., Hsinchu (TW)

(72) Inventors: Wei-Han Lai, New Taipei (TW); Ching-Yu Chang, Yilang County (TW); Chin-Hsiang Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/599,851

(22) Filed: May 19, 2017

(65) Prior Publication Data

US 2018/0337058 A1   Nov. 22, 2018

(51) Int. Cl.
| | |
|---|---|
| *H01L 21/308* | (2006.01) |
| *H01L 21/033* | (2006.01) |
| *H01L 21/027* | (2006.01) |
| *H01L 21/02* | (2006.01) |
| *H01L 21/3105* | (2006.01) |
| *G03F 7/11* | (2006.01) |
| *B05D 3/10* | (2006.01) |
| *C09D 133/10* | (2006.01) |
| *C08L 33/10* | (2006.01) |
| *C09D 133/12* | (2006.01) |

(Continued)

(52) U.S. Cl.
CPC .......... *H01L 21/3081* (2013.01); *B05D 3/06* (2013.01); *B05D 3/108* (2013.01); *C08L 33/10* (2013.01); *C08L 33/12* (2013.01); *C09D 133/08* (2013.01); *C09D 133/10* (2013.01); *C09D 133/12* (2013.01); *C09D 135/02* (2013.01); *G03F 7/11* (2013.01); *H01L 21/0274* (2013.01); *H01L 21/02318* (2013.01); *H01L 21/02345* (2013.01); *H01L 21/0332* (2013.01); *H01L 21/3086* (2013.01); *H01L 21/3105* (2013.01)

(58) Field of Classification Search
None
See application file for complete search history.

(56) References Cited

U.S. PATENT DOCUMENTS

| | | | |
|---|---|---|---|
| 8,796,666 | B1 | 8/2014 | Huang et al. |
| 9,012,132 | B2 | 4/2015 | Chang |

(Continued)

OTHER PUBLICATIONS

Crosslinker Selection Guide, Retrieved May 18, 2017, https://www.thermofisher.com/tw/zt/home/life-science/protein-biology/protein-labeling-crosslinking/protein-crosslinking/crosslinker-selection-guide.html, 4 pgs.

*Primary Examiner* — Jiong-Ping Lu
(74) *Attorney, Agent, or Firm* — Haynes and Boone, LLP (57) ABSTRACT

Provided is a material composition and method for that includes providing a primer material including a surface interaction enhancement component, and a cross-linkable component. A cross-linking process is performed on the deposited primer material. The cross-linkable component self-cross-links in response to the cross-linking process to form a cross-linked primer material. The cross-lined primer material can protect an underlying layer while performing at least one process on the cross-linked primer material.

20 Claims, 8 Drawing Sheets

(51) Int. Cl.
  *B05D 3/06* (2006.01)
  *C09D 133/08* (2006.01)
  *C08L 33/12* (2006.01)
  *C09D 135/02* (2006.01)

(56) References Cited

U.S. PATENT DOCUMENTS

| | | |
|---|---|---|
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 2015/0187565 A1* | 7/2015 | Su .................. H01L 21/0276 438/703 |

* cited by examiner

METHOD OF SEMICONDUCTOR DEVICE FABRICATION HAVING APPLICATION OF MATERIAL WITH CROSS-LINKABLE COMPONENT

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As one example, as pattern sizes shrink the condition of the surface to be processed can affect the quality and reliability of the device. Further, any preparation of the surface to be processed (e.g., etching, cleaning, deposition of a layer thereon) must be suitable to be maintained throughout subsequent processes if desired. As merely one example, many fabrication steps involve the formation and manipulation of thin films of material formed on a substrate or wafer. Defects, imperfections, irregularities, and contaminants in a surface upon which these materials are formed may undermine the fabrication process and may precipitously affect both yield and device performance. Existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further still, the reference to the term "substrate" herein includes, but is not limited to a semiconductor substrate. For example, the substrate may be a semiconductor substrate materials such as silicon, germanium, silicon carbide (SiC), silicon germanium (SiGe), diamond, compound semiconductors, alloy semiconductors, and the substrate may optionally include one or more epitaxial layers (epi-layers), may be strained for performance enhancement, may include a silicon-on-insulator (SOI) structure, and/or have other suitable enhancement features. Additionally however, the term "substrate" and target surface thereof may also include features and layers formed on the semiconductor substrate such as metal layers, insulating layers (e.g., SiO2, SixNy), metal oxide layers, bottom anti-reflective coating (BARC) layers, photoresist layers, and/or other suitable materials used in semiconductor processing and where a surface condition is desirable for future processing.

It is also noted that the present disclosure presents embodiments that may be employed to for the fabrication of planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of devices that may benefit from aspects of the present disclosure.

The present disclosure is generally related to methods for semiconductor device fabrication, and more particularly to material compositions for preparing a target surface of the substrate for further processing. In some embodiments, the material compositions may be used as part of a typical lithography patterning process, as one or more layers of a multi-layer resist which is patterned with an IC design layout. In some embodiments, a preparation of a surface for further processing such as additional material deposition, cleans, wet etching, dry etching, and the like is provided.

With respect to surface preparation, there has been a movement in the semiconductor industry to use metal-gate technology in lieu of traditional polysilicon-based gates. Another area of development of semiconductor fabrication is in etching processes, which have been required to become more selective, etch more complex film structures, and/or provide finer etch patterns. In order to accomplish these, and other advanced semiconductor fabrication techniques, it is important to recognize that surface preparation to provide a suitable reactive/non-reactive surface and uniformity is critical. For example, it may be desired to modify the target surface to provide a suitable contact angle (e.g., with respect to a water droplet), a suitable hydrophobicity, or a suitable hydrophilic nature to provide adequate affinity (e.g., adhesion) with respect to an overlying layer and/or protection from additional processes (e.g., etches, cleans).

While some surface preparation materials have been proposed for semiconductor fabrication, many include disadvantages. One disadvantage is unwanted consumption of the surface prep materials in subsequent processes such as, for example, wet processes (organic solvent wash, acid liquid exposure, basic liquid exposure) or dry processes (dry etchings). This consumption can result because of a weak interaction between the surface prep material and the surface it is formed on. This consumption of the surface prep material can leave a then exposed surface in a state undesirable for the further processing, or in some cases, the consumption of the surface prep material can leave the surface of an underlying layer (e.g., such as oxide, metal, metal oxide, etc) exposed and at risk for damage by the subsequent processes. Another of the disadvantages of the surface prep materials can be difficulties in controlling and/or achieving a desired thickness. For example, surface prep materials that are applied as a monolayer often cannot achieve a desired greater thickness. In such cases, use of surface prep materials as a gap filling material can be difficult or impossible to achieve. As above, an insufficient gap fill can leave underlying layers at risk from damage from subsequent processing. As such, some of the embodiments presented herein provide improvements to one or more these disadvantages.

Some of the embodiments provided herein provide for creating and/or using a primer material that includes the desired surface preparation component—referred to as a surface interaction enhancement component, and also a cross-linkable component. These components together, surface interaction enhancement component and a cross-linkable component (along with any solvent or water solution in which they may be suspended for deposition), are applied as a primer material. These primer materials comprising the surface interaction enhancement component and the cross-linkable component together can allow in some embodiments for control of thickness to provide adequate gap fill, provide a stronger interaction with the surface it is applied to, allow for protection of an underlying layer(s) by, in some embodiments, allowing for an reduction in or remedy of unwanted consumption of the primer material. Various methods of using the primer material and various primer material compositions are discussed below, however, it can be appreciated that similar methods and compositions can be applied to other materials and processes as well. Embodiments of the present disclosure offer advantages over the existing art, though it is understood that other embodiments may offer different advantages, not all advantages are necessarily discussed herein, and no particular advantage is required for all embodiments.

Figure 1:
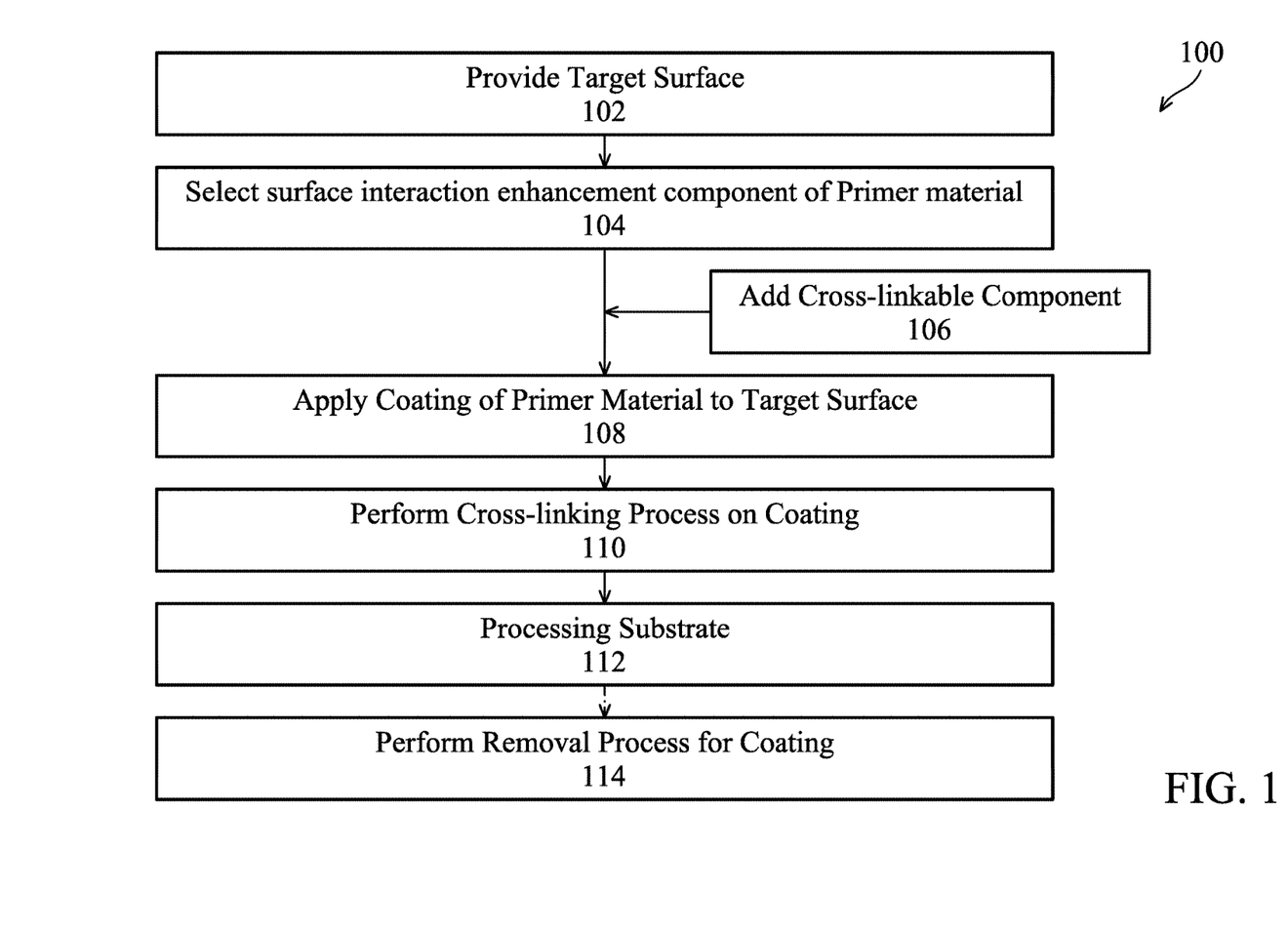
FIG. 1 is a flow chart illustrating an embodiment of a method of fabricating a semiconductor device including applying a primer material according to one or more aspects of the present disclosure.

With reference to the example of FIG. 1, provided is an embodiment of a method 100 of certain steps of fabricating a device (such as a semiconductor device) using a primer material according to aspects of the present disclosure. It is noted that additional steps may also be provided before, during, and after the method 100, and some steps described can be replaced, eliminated, or moved before or after other steps for additional embodiments of the method. It is also noted that the method 100 is exemplary, and is not intended to limit the present disclosure beyond what is explicitly recited in the claims that follow. The method 100 will be further described below in conjunction with FIGS. 2A-9.

The method 100 begins at block 102 where a target surface is provided. The target surface may be any one or more of a variety of compositions including a dielectric, a metal, a semiconductor, a polymer such as photoresist, a hard mask material, a bottom antireflective coating (BARC), and/or other suitable surfaces. The target surface may be the surface of the semiconductor substrate (e.g., silicon wafer) itself, or a surface of a layer or layer(s) formed thereon. In some embodiments, the target surface may be substantially planar. Using the example of FIG. 2A, a device 200 having a substrate 202 is provided. The substrate 202 has a surface 202A. In some embodiments, the target surface may be patterned features. Using the example of FIG. 2B, a device 200' having a patterned feature 206, which in some embodiments may be substrate 202 or a layer formed thereon, is provided. The patterned feature 206 may include a layer 208 disposed thereon. In some embodiments, the layer 208 is a dielectric layer such as, for example, an oxide ($SiO_2$) or a nitride ($S_xN_y$), a metal, a metal nitride, and/or other suitable composition. In other embodiments, the layer 208 is omitted. The layer 208 includes a surface 208A.

Figure 2A:
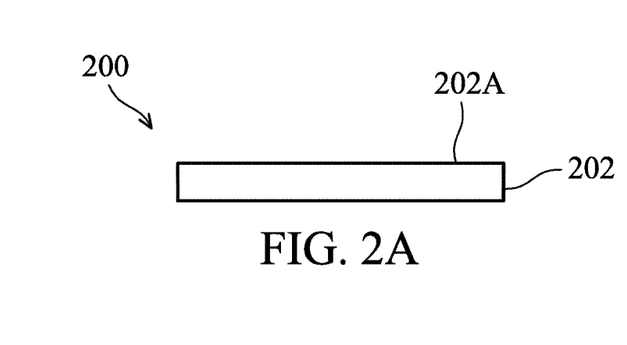
FIGS. 2A, 3A, 4A, 6A, and 7A show cross-sectional views of a semiconductor structure, at intermediate steps corresponding to various steps of an exemplary embodiment of the method of FIG. 1.

The substrate 202 may be a semiconductor wafer, such as a silicon wafer. Additionally, in some embodiments, the substrate 202 may include various layers, including conductive or insulating layers formed on a semiconductor substrate. The substrate 202 may further include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features. The substrate 202 may include any number of layers disposed thereon including but not limited to insulating layers, conductive layers, metal layers, semiconductive layers, polymer layers, and the like.

The substrate 202 includes a target surface 202A. The target surface 202A is an exposed surface of the substrate 202, which is targeted for subsequent processing including, but not limited to, cleaning, etching, or depositing of materials thereon. The surface 202A may have a given known property. In some examples, the property is its given hydrophobic or hydrophilic nature, such as measured by a contact angle to a water droplet.

Figure 2B:
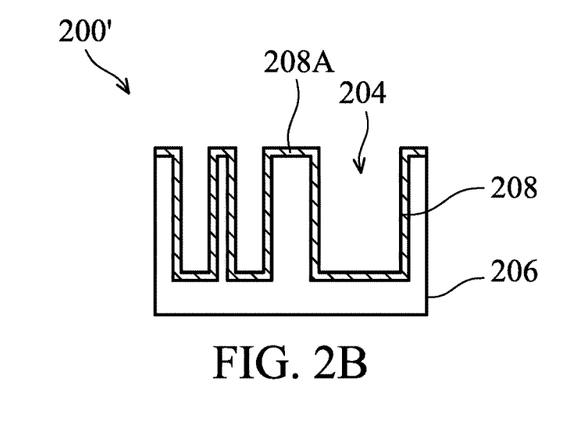
FIGS. 2B, 3B, 4B, 6B, and 7B show cross-sectional views of a semiconductor structure, at intermediate steps corresponding to various steps of another exemplary embodiment of the method of FIG. 1.

Referring to FIG. 2B and device 200', the feature 206 and overlying layer 208 includes a target surface 208A. The target surface 208A is the exposed surface of the layer 208 disposed on the feature, which is targeted for subsequent processing including, but not limited to, cleaning, etching, or depositing of materials thereon. In an embodiment, the subsequent processing includes a desired gap fill of the gaps 204 provided in the feature 206. The surface 208A may have a given known property. In some examples, the property is its hydrophobic or hydrophilic nature such as measured by a contact angle to a water droplet. In an embodiment, the surface 208A is a metal-containing surface. In an embodiment, the surface 208A contains TiN. In a further embodiment, the surface 208A is formed by depositing titanium (Ti) and nitrogen (N).

In an embodiment, the gaps 204 have a width of less than approximately 10 nanometers (nm).

The method 100 then proceeds to block 104 where a surface interaction enhancement component suitable for the primer material is determined. The surface interaction enhancement component determined in block 104 is that component that proves for a surface interaction enhancement and/or provides for an enhanced surface property and thus, is referred to a surface interaction component.

Returning to the example of substrate 202 and FIG. 2A, in some embodiments, the nature of the surface 202A is such that a change in the contact angle is desired to allow for better interaction with a subsequent process. In some examples, it is desired to decrease the contact angle. In some embodiments, it is desired to increase the contact angle. For example, closer matching of contact angles between the surface 202A and a subsequently deposited layer may be useful for providing affinity between the two layers which can result in improved adhesion. Similarly, a certain contact angle may be desired to provide optimal processing of a subsequent process, for example, a wet etch (e.g., a 45 and 70 degrees water droplet angle for a wet etch process). The desired modification to the nature of a target surface over the substrate 202 may be provided by applying a primer material, and in particular, the surface interaction enhancement component of the primer material. In an embodiment, the surface interaction enhancement component of the primer material is selected such that it provides a decreased contact angle with a water droplet; in an embodiment, the surface interaction enhancement component of the primer material is selected such that it provides an increased contact angle with a water droplet. In some embodiments, the nature of the surface 202A and/or the layer of substrate 202 is such that it is desired to be protected from effects of subsequent processes.

Returning to the example of the feature 206 and FIG. 2B, in some embodiments, there is a desire to not only provide a surface interaction enhancement or protection layer as discussed above, but also fill the gap 204. In some examples, it is desired to enhance a target surface by decreasing the contact angle. In some embodiments, it is desired to enhance a target surface by increasing the contact angle. For example, closer matching of contact angles between the surface 208A and a subsequently deposited layer may be useful for providing an improved affinity with an overlying layer (e.g., improving adhesion). Similarly, a certain contact angle may be desired to provide optimal processing of a subsequent process, for example, a wet etch (e.g., a 45 and 70 degrees water droplet angle for a wet etch process). The desired modification to the nature of the target surface of 208A may be provided by applying a primer material, and in particular, the surface interaction enhancement component of the primer material. In an embodiment, the surface interaction enhancement component of the primer material is selected such that it provides a decreased contact angle with a water droplet; in an embodiment, the surface interaction enhancement component of the primer material is selected such that it provides an increased contact angle with a water droplet.

As but one example, in an embodiment, the surface 202A/208A includes an oxide forming layer (e.g., Si, SiO2, SiN), which may be naturally hydrophilic due to absorbed and surface layer water from ambient humidity. Unless the surface is condition is altered prior to coating a subsequent layer (e.g., photoresist), this hydrophilic surface can allow incident chemicals to penetrate the layer (e.g., resist)/substrate interface and cause damage. To ensure adhesion during processing, these hydrophilic surfaces can be converted to a hydrophobic state by applying a suitable surface interaction enhancement component of the primer material.

As another example, in an embodiment, the surface 202A/208A includes metal, such as a work function metal of a gate structure. It may be desired to improve the adhesion between the metal and an overlying layer by including a primer material.

As another example, in an embodiment, the surface 202A/208A is a dielectric such as TiON surface. It may be desired to improve the adhesion between the dielectric and an overlying layer by including a primer material.

In some embodiments, the surface 202A/208A is any one of the semiconductor, dielectric, or metal compositions (e.g., as discussed above) and it is desired to apply the primer material to enhance the exposed surface by protecting the surface 202A/208A and/or any underlying layers from damage or attack by subsequent processes (e.g., etching, deposition, etc.).

The component of the primer material selected for the protection or modification of the exposed surface, referred to as the surface interaction enhancement component of the primer material, is selected such that it provides any or all of the functions above or other functions desired. In some embodiments, the surface interaction enhancement component of the primer material may be a nitrogen-containing polymer or monomer material. One example of the surface interaction enhancement component of the primer material is pyridine. For example, in some embodiments the target surface is a metal-containing surface. Pyridine when applied to a surface (e.g., metal containing surface) provides an interaction with a metal containing substrate and provides hydrophobic nature. This may provide benefits for preparing the surface for wet etching resistance. Other exemplary surface interaction enhancement components include those components with a two carbon double bond cyclic structure which also include nitrogen.

After determining, selecting, and/or providing the surface interaction enhancement component of the primer material, for example, the nitrogen-comprising polymer/monomer, the method 100 proceeds to block 106 where a cross-linkable component is added to the surface interaction enhancement component to form the primer material. The cross-linkable component may be a self-cross-linkable chemical compound such that it forms a network structure. Self-cross-linking as used herein provides for the component linking with itself (i.e., the cross-linkable component) rather than other compounds within the solution such as the surface interaction enhancement component). In some embodiments, the cross-linking provides for two molecules of the cross-linkable component to be joined by a covalent or ionic bond. In other words, reactive ends of a molecule or compound of the cross-linkable component join with another reactive end of another molecule or compound of the cross-linkable component by covalent/ionic bonding to form a network structure. The network structure can keep surface interaction enhancement component of the primer suitably positioned (e.g., surrounded by the network structure) in the deposited layer of primer. This can allow for example for control of the thickness and/or protection of the surface interaction enhancement component of the primer material from undesired removal.

In an embodiment, the cross-linkable component is an ester-type (self-) cross-linking component. In an embodiment, the cross-linkable compound is an epoxy-type (self-) cross-linking component. A non-exhaustive, exemplary list of cross-linkable components is provided in the Table below.

Figure 5:
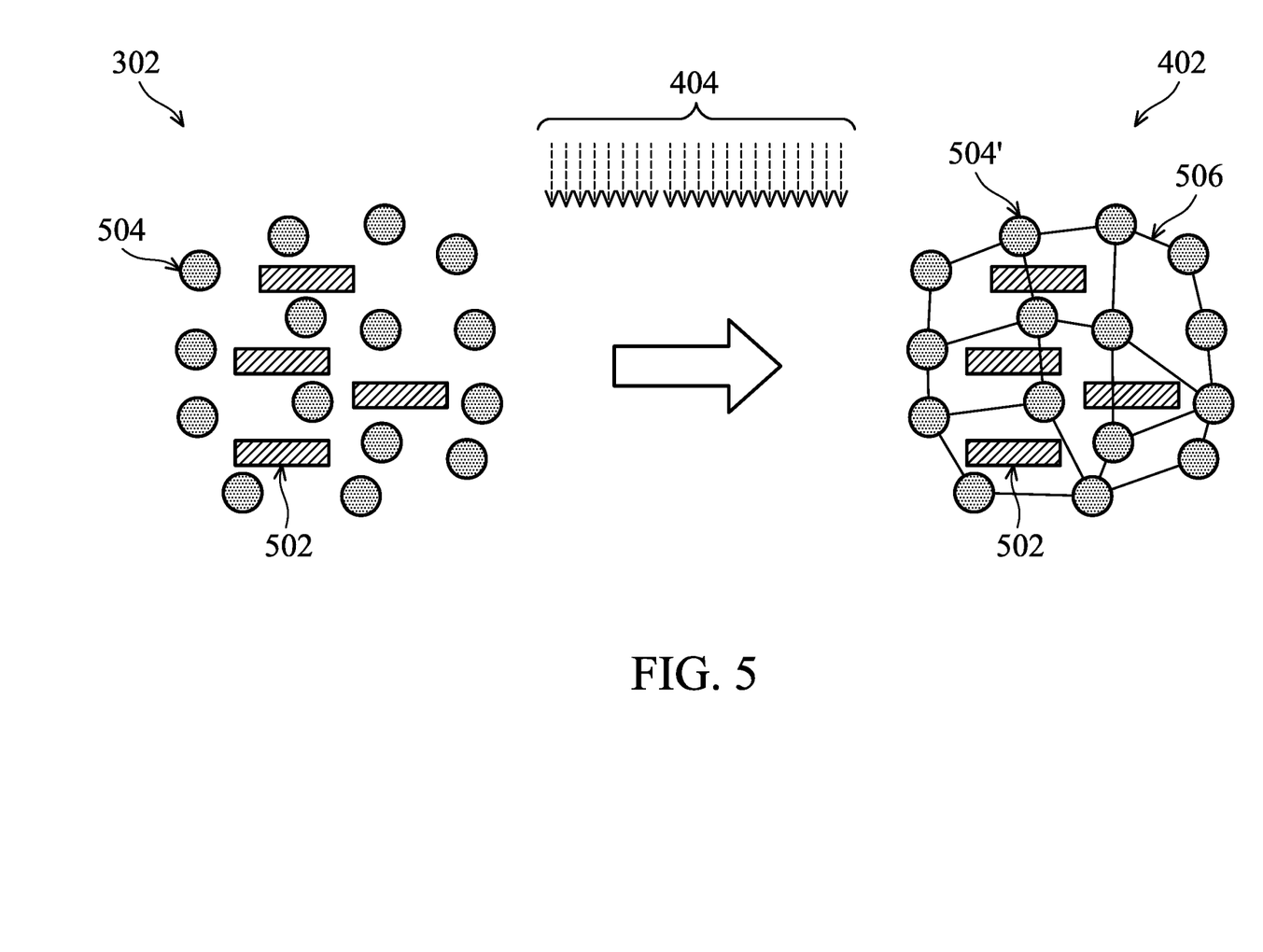
FIG. 5 shows examples of a material composition, before and after a cross-linking step is applied, in accordance with some embodiments.

Referring to the example of FIG. 5, illustrated is a pictorial representation of a primer material 302 including the surface interaction enhancement component 502 and the cross-linkable component 504. As illustrated, the surface interaction enhancement component 502 and the cross-linkable component 504 are interspersed in the solution of the primer material 502. In at least some embodiments, there is no covalent bonding between the surface interaction enhancement component 502 and the cross-linkable component 504. The primer material 502 is representative of the state of the primer material 502 before and/or at deposition and prior to any cross-linking process discussed below.

The cross-linkable component added in block 106 such as cross-linkable component 504 may be a compound with a structure possible to form a network film to prevent the surface interaction enhancement component 502 from being removed in subsequent process(es) and/or to provide thickness (e.g., allow for gap fill). In an embodiment, the cross-linkable component is a self-cross-linking component as discussed above. The cross-linkable component 504 is self-cross-linking such that two or more molecules (also referred to as reactive groups) of the cross-linkable component 504 covalently or ionically bonded together. In some embodiments, a plurality of different compositions of cross-linkable components 504 are included in the primer material 302 and the cross-linkable components 504 may cross-link to components having the same chemical structure or components having a different chemical structure.

Exemplary cross-linker components are provided in the Table 1 below:

TABLE 1

| Chemical Structure | Name | Reactive Group |
|---|---|---|
| (tetramethylolglycoluril structure) | tetramethylolglycoluril | —OH group |
| (EGDMA structure) | Ethylene glycol dimethylacrylate (EGDMA) | Ester-type reaction |
| (DVB structure) | Divinylbenzene (DVB) | CC double bond |
| (epoxide structure) | epoxy based polymer | Epoxy type reaction |
| (bis-epoxide structure) —$CH_2O$—$(CH_2)n$—$OCH_2$— | propylene oxide | Epoxy type reaction |
| (TRIM structure) | Trimethylolpropane trimethacrylate (TRIM) | —OH group and CC double bond |

TABLE 1-continued

| Chemical Structure | Name | Reactive Group |
|---|---|---|
|  | pentaerythritol triacrylate (PETRA) | —OH group and CC double bond |
|  | Ethylene glycol diacrylate | —OH group and CC double bond |
|  | Bis(2-methacryloyl)oxyethyl disulfide | —OH group and CC double bond |
|  | Epoxy based: Triglycidyl p-aminophenol | Epoxy based reaction |

Another Table (Table 2) is provided below illustrating additional exemplary cross-linking components that may be suitable for use in the methods of the present disclosure. As above, in some embodiments, these compounds are also self-cross linking.

TABLE 2

| Reactive groups, features | Crosslinker products | Product Name |
|---|---|---|
| NHS esters | DSG | disuccinimidyl glutarate |
|  | DSS | disuccinimidyl suberate |
|  | BS3 | bis(sulfosuccinimidyl)suberate |
|  | TSAT (trifunctional) | tris-(succinimidyl)aminotriacetate |
| NHS esters, PEG spacer | BS(PEG)5 | PEGylated bis(sulfosuccinimidyl)suberate |
|  | BS(PEG)9 | PEGylated bis(sulfosuccinimidyl)suberate |
| NHS esters, thio-cleavalbe | DSP | dithiobis(succinimidyl propionate) |
|  | DTSSP | 3,3'-dithiobis(sulfosuccinimidyl propionate) |
| NHS esters, misc-cleavable | DST | disuccinimidyl tartrate |
|  | BSOCOES | bis(2-(succinimidooxycarbonyloxy)ethyl)sulfone |
|  | EGS | ethylene glycol bis(succinimidyl succinate) |
|  | Sulfo-EGS | ethylene glycol bis(sulfosuccinimidyl succinate) |
| Imidoesters | DMA |  |
|  | DMP | dimethyl pimelimidate |
|  | DMS | dimethyl suberimidate |
| Imidoesters, thiol-cleavable | DTBP |  |
| Other | DFDNB | 1,5-difluoro-2,4-dinitrobenzene |
| Maleimides | BMOE | bismaleimidoethane |
|  | BMB | 1,4-bismaleimidobutane |
|  | BMH | bismaleimidohexane |
|  | TMEA (trifunctional) | tris(2-maleimidoethyl)amine |
| Maleimides, PEG spacer | BM(PEG)2 | 1,8-bismaleimido-diethyleneglycol |
|  | BM(PEG)3 | 1,11-bismaleimido-triethyleneglycol |
| Maleimides, cleavable | DTME | dithiobismaleimidoethane |

TABLE 2-continued

| Reactive groups, features | Crosslinker products | Product Name |
|---|---|---|
| NHS ester/ maleimide | AMAS | N-α-maleimidoacet-oxysuccinimide ester |
| | BMPS | N-β-maleimidopropyl-oxysuccinimide ester |
| | GMBS and Sulfo-GMBS | N-γ-maleimidobutyryl-oxysuccinimide ester and N-γ-maleimidobutyryl-oxysulfosuccinimide ester |
| | MBS and sulfo-MBS | m-maleimidobenzoyl-N-hydroxysuccinimide ester and m-maleimidobenzoyl-N-hydroxysulfosuccinimide ester |
| | SMCC and Sulfo-SMCC | succinimidyl 4-(N-maleimidomethyl)cyclohexane-1-carboxylate and sulfosuccinimidyl 4-(N-maleimidomethyl)cyclohexane-1-carboxylate |
| | EMCS and Sulfo-EMCS | N-ε-maleimidocaproyl-oxysuccinimide ester and N-ε-maleimidocaproyl-oxysulfosuccinimide ester |
| | SMPB and Sulfo-SMPB | succinimidyl 4-(p-maleimidophenyl)butyrate and sulfosuccinimidyl 4-(N-maleimidophenyl)butyrate |
| | SMPH | Succinimidyl 6-((beta-maleimidopropionamido)hexanoate)) |
| | LC-SMCC | succinimidyl 4-(N-maleimidomethyl)cyclohexane-1-carboxy-(6-amidocaproate)) |
| | Sulfo-KMUS | N-κ-maleimidoundecanoyl-oxysulfosuccinimide ester |
| NHS ester/ maleimide, PEG spacer | SM(PEG)2 | PEGylated SMCC crosslinker |
| | SM(PEG)4 | PEGylated SMCC crosslinker |
| | SM(PEG)6 | PEGylated, long-chain SMCC crosslinker |
| | SM(PEG)8 | PEGylated, long-chain SMCC crosslinker |
| | SM(PEG)12 | PEGylated, long-chain SMCC crosslinker |
| | SM(PEG)24 | PEGylated, long-chain SMCC crosslinker |
| NHS ester/ pyridyldithiol, cleavable | SPDP or SPDP | succinimidyl 3-(2-pyridyldithio)propionate or Succinimidyl 3-(2-Pyridyldithio)Propionate (SPDP) |
| | LC-SPDP and sulfo-LC-SPDP | succinimidyl 6-(3(2-pyridyldithio)propionamido)hexanoate and Sulfo-LC-SPDP (sulfosuccinimidyl 6-(3'-(2-pyridyldithio)propionamido)hexanoate) |
| | SMPT | 4-succinimidyloxycarbonyl-alpha-methyl-α(2-pyridyldithio)toluene |
| | PEG4-SPDP | PEGylated, long-chain SPDP crosslinker |
| | PEG12-SPDP | PEGylated, long-chain SPDP crosslinker |
| NHS esters/ haloacetyl | SIA | succinimidyl iodoacetate |
| | SBAP | succinimidyl 3-(bromoacetamido)propionate |
| | SIAB | succinimidyl (4-iodoacetyl)aminobenzoate |
| | Sulfo-SIAB | sulfosuccinimidyl (4-iodoacetyl)aminobenzoate |
| NHS ester/ aryl azide | ANB-NOS | N-5-azido-2-nitrobenzoyloxysuccinimide |
| | Sulfo-SANPAH | sulfosuccinimidyl 6-(4'-azido-2'-nitrophenylamino)hexanoate |
| | ATFB | |
| NHS ester/ diazirine | SDA and sulfo-SDA | (NHS-Diazirine) (succinimidyl 4,4'-azipentanoate) |
| | LC-SDA and Sulfo-LC-SDA | NHS-LC-Diazirine) (succinimidyl 6-(4,4'-azipentanamido)hexanoate |
| NHS ester/ diazirine, cleavable | SDAD and Sulfo-SDAD | Sulfo-NHS-SS-Diazirine) (sulfosuccinimidyl 2-((4,4'-azipentanamido)ethyl)-1,3'-dithiopropionate) |
| Carbodiimide | DCC | |
| | EDC or EDAC | 1-ethyl-3-(3-dimethylaminopropyl)carbodiimide hydrochloride |
| | See also: NHS and Sulfo-NHS | N-hydroxysuccinimide |
| Maleimide/ hydrazide | BMPH | N-β-maleimidopropionic acid hydrazide |
| | EMCH | N-ε-maleimidocaproic acid hydrazide |
| | MPBH | 4-(4-N-maleimidophenyl)butyric acid hydrazide |
| | KMUH | N-κ-maleimidoundecanoic acid hydrazide |

TABLE 2-continued

| Reactive groups, features | Crosslinker products | Product Name |
|---|---|---|
| Pyridyldithiol/ hydrazide | PDPH | 3-(2-pyridyldithio)propionyl hydrazide |
| Isocyanate/ maleimide | PMPI | p-maleimidophenyl isocyanate |
| NHS ester/ | SPB | succinimidyl-[4-(psoralen-8-yloxy)]-butyrate |

As discussed above, any one or more of these components may be present as cross-linkable component of the primer material and may be suitable to bond to itself of another component including other components of the Table 1 or Table 2 above.

In some embodiments, the weight percentage of the cross-linkable component may be at least 1% by weight of the primer material.

The preparation of the primer material in some embodiments provides for mixing the components of the primer material including the cross-linkable component and the surface interaction enhancement component prior to application to the target surface, as discussed below.

Figure 3A:
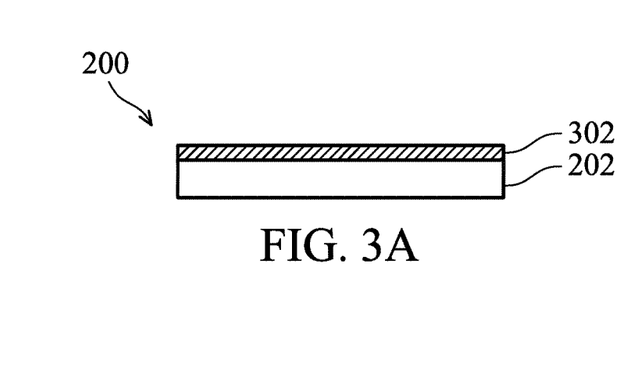
Figure 3B:
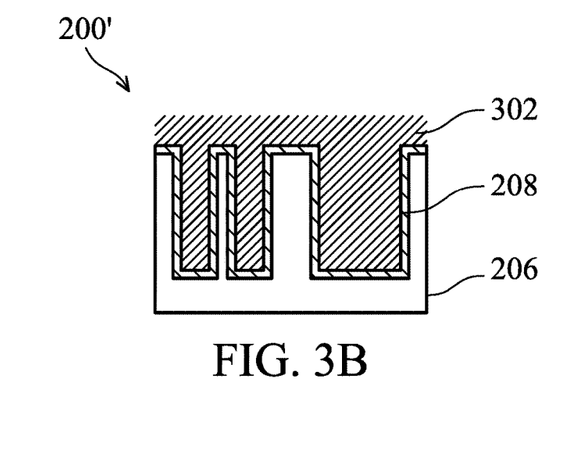

The method 100 then proceeds to block 108 where the primer material (including the surface interaction enhancement component and the cross-linkable component) are applied to the target surface. In an embodiment, the primer material is applied using a spin coating process. By way of example, a thickness of the alternative ML material layer 806 may be controlled by a spin speed, dispensing flow rate, dispensing time, and other factors, of the spin-coating process. Other deposition methods include but are not limited chemical vapor deposition. The primer material may be applied to a thickness of greater than 5 nm. In some embodiments, the thickness may be sufficient to fill a gap such as a trench. Referring to the example of FIGS. 3A, 3B, the primer material 302 is applied to the target surface 202A and 208A respectively. As discussed above, and with reference to FIG. 5, the primer material 302 includes a surface interaction enhancement component 502 and a cross-linkable component 504. The device 200 or 200' respectively after application of the primer material 302 may have a modified exposed target surface (e.g., a top surface of the primer material 302). As discussed above, in some embodiments, the modified target surface (i.e., now primer material 302 as compared to surface 202A/208A) may have a modified contact angle with a water droplet providing a change in hydrophobicity/hydrophilicity.

The method 100 then proceeds to block 110 where a cross-linking process is performed on the primer material coating disposed on the substrate. The cross-linking process may include a process that initiates the chemical reactions to form the self-cross-linking. In some embodiments, the cross-linking process includes exposing the coating to an elevated temperature. In some embodiments, the cross-linking process is a thermal process such as a bake. The bake may be greater than 50 Celsius and for example, greater than 30 seconds as exemplary process conditions. In some embodiments, the cross-linking process includes exposing the coating to a radiation. The radiation may be visible light, UV radiation, EUV radiation, and/or other radiation wavelengths suitable to initiate the cross-linking reaction in the cross-linkable component of the primer material. In some embodiments, the wavelength of the radiation is between 50 nm and 1000 nm. In some embodiments, the duration of the radiation is about 5 seconds.

Figure 4A:
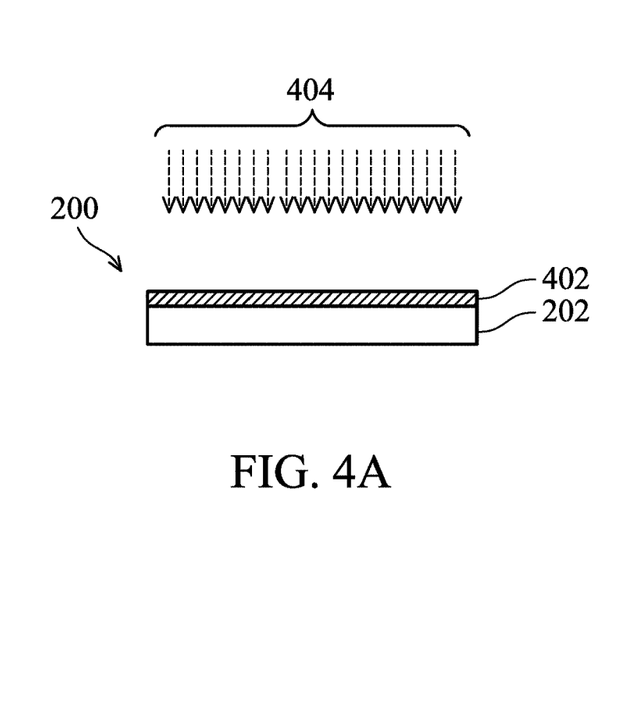
Figure 4B:
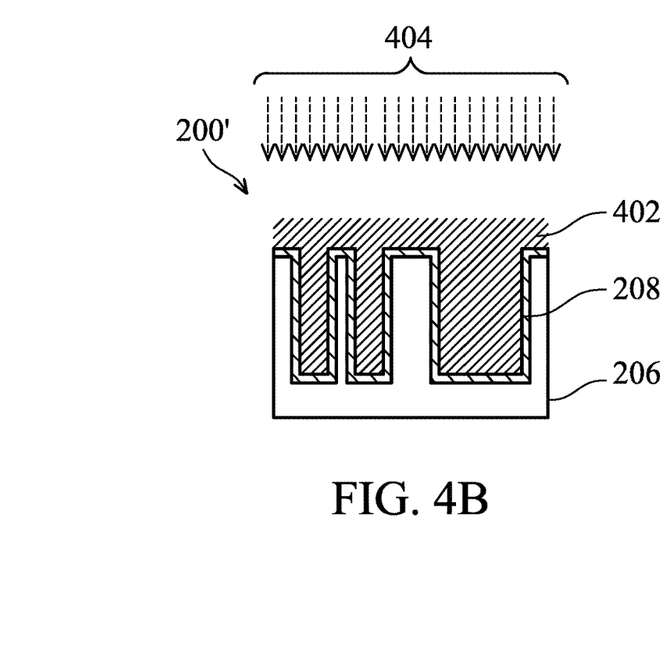

As illustrated by the example of FIGS. 4A and 4B, the cross-linking process 404 is illustrated as being applied to the primer material coating 302. As discussed above, the cross-linking process 404 may include a heat source or a radiation source. In some embodiments, the primer material 302 has a composition that is initially solvent soluble (FIG. 5). After exposure to the cross-linking process 404, the material becomes primer material 402, which may be solvent non-soluble after a cross-linking process 404. Stated another way, the primer material composition becomes cross-linked upon initiation of a given process.

Referring to the illustration of FIG. 5, the cross-linking process 404 is applied to the primer material 302 (which includes the surface interaction enhancement component 502 and the cross-linkable component 504 where the cross-linkable component 504 is not cross-linked). After application of the cross-linking process 404, the primer material 302 is modified and illustrated as the primer material 402. The primer material 402 includes the surface interaction enhancement component 502 and the cross-linkable component 504', which is the cross-linkable component 504 after cross-linking—i.e., ionic/covalently bonding of two or molecules of the cross-linkable component 504 provide component 504'. The bonding of the self-cross-linking is illustrated as a network of bonds 506. In some embodiments, the surface interaction enhancement component 502 is unchanged.

As illustrated by the example of FIGS. 4A and 4B, the cross-linking process 404 is applied to the device 200, 200', which produces a coating of the primer material 402, where the cross-linkable component is in the cross-linked state. The cross-linking process 404 may be one of a radiation exposure (e.g., UV, visible light) or a thermal process (e.g., bake).

The method 100 then proceeds to block 112 where the substrate, having the applied primer material, is further processed. In an embodiment, a wet clean or etch is performed on the device. In an embodiment, a deposition of a material is provided onto the applied primer material. As discussed above, in some embodiments, the deposited material has a contact angle with a water droplet that is substantially similar to that of the applied primer material. The deposited material may be a metal layer (e.g., a portion of a metal gate feature), a dielectric layer (e.g., a gate dielectric), and/or other suitable semiconductor features.

In some examples, the primer material is formed as part of a patterning process. In some examples, the primer material is formed to provide an improved surface for patterning material (e.g., resist) deposition. In an embodiment, the primer material is formed under a BARC layer, on which in turn a photoresist (resist) is formed. In some examples, the primer material is formed on the BARC layer, prior to formation of the resist (e.g., deposited onto the primer material) to improve the interaction between the BARC layer and overlying resist. In some examples, the primer material is formed as part of a stack of resist materials (e.g., a multi-layer resist). In some embodiments, the resist layer or layers formed over the primer material (e.g., in some embodiments, directly on the primer material).

Figure 6A:
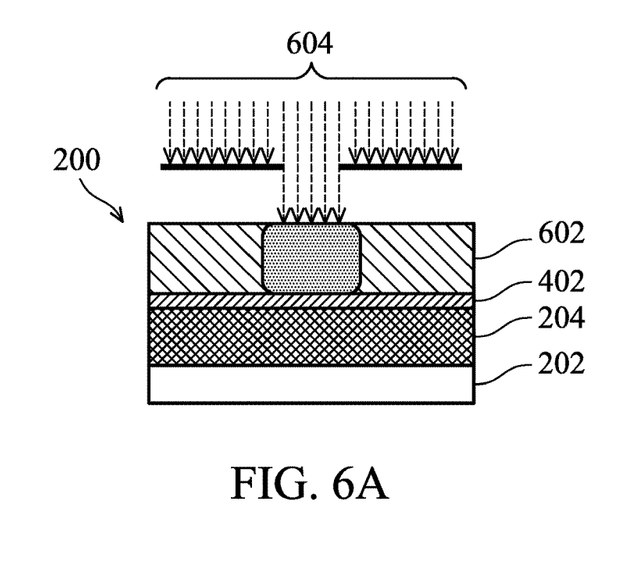
Figure 6B:
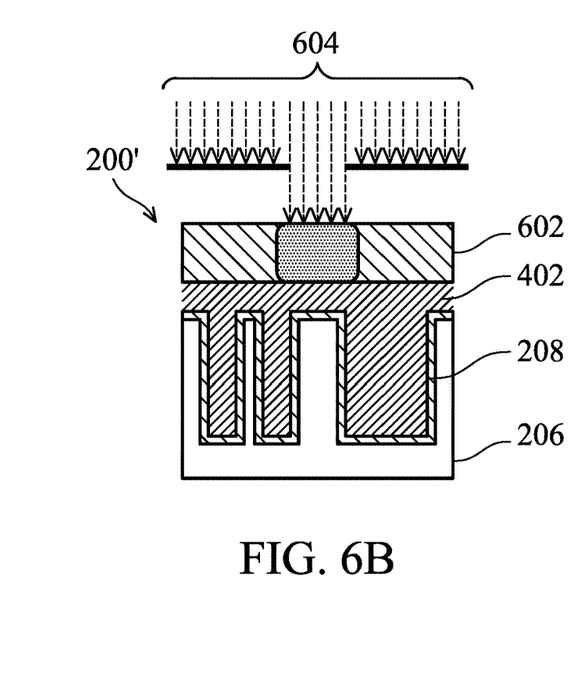

Referring to the examples of FIGS. 6A and 6B, illustrated is further processing of the devices 200, 200' respectively illustrating an exemplary patterning process. A layer 602 is disposed over primer material 402 (being in a cross-linked state). In some embodiments the layer 602 is a photoresist layer. The layer 602 may include a material containing one or more of carbon (C), hydrogen (H), and oxygen (O). Different resist materials may be used for processes employing a KrF laser as the radiation source (248 nm), an ArF laser as the radiation source (193 nm), other types of resist materials and radiation sources and radiation wavelengths may be used (e.g., EUV, e-beam). As illustrated, an exposure process 604 is performed for patterning the layer 602 by patterning a radiation beam through use of a photomask. However, it is noted that various other patterning methods of the layer 602 may also be employed.

In some embodiments, the primer material 402 is maintained on the device 200, 200' for one or more processes, and subsequently removed (see below). In other embodiments, the primer material 402 is maintained on the substrate in the final device associated with devices 200, 200'.

In the embodiments where it is desired to remove the primer material, the method 100 proceeds to block 114. (As indicated above, in some embodiments, block 114 is omitted.) When removal is desired, the primer material composition and method 100 provides for de-cross-linking a previously cross-linked primer material, such that the de-cross-linked primer material may be readily removed (e.g., by a solvent in which it is soluble) for example without damaging an underlying substrate layer.

In some embodiments, the removal of the primer material includes a decomposing process, which de-cross-links the cross-linkable component of primer material 402 and in particular, de-cross-links the cross-linkable component 504'. In an embodiment, the decomposing process includes a treatment by a base or acid. The treatment with a base may be exposure to a fluid (liquid or gas) having a pH greater than approximately 10. The treatment with an acid may be exposure to a fluid (liquid or gas) having a pH less than approximately 5. In some embodiments, the base and/or acid may be in liquid form.

In an embodiment, an ester type cross-linkable component 504' can be decomposed by a basicity treatment. The basicity treatment may be application of tetramethylammonium hydroxide (TMAH), KOH, and/or other suitable base. In an embodiment, an epoxy type cross-linkable component 504' can be decomposed by an acidity treatment. The acidity treatment may include any solution with a pH below 7 including for example introduction of HCl.

In some embodiments, the de-composing process provides two functions—de-cross-linking the cross-linkable component 504' to form de-cross-linked component 504" and also dissolving of the primer material 804 including the de-cross-linked component 504". In some embodiments, the de-composing process removes the primer material 804 from a substrate entirely. In other embodiments, a plurality of steps may be performed—for example, a de-composing process to de-cross-link the cross-linkable component and form de-cross-linked component 504", and a separate solution in which the de-cross linked component 504" and the primer material 804 is soluble in to remove the primer material from the substrate.

Figure 8:
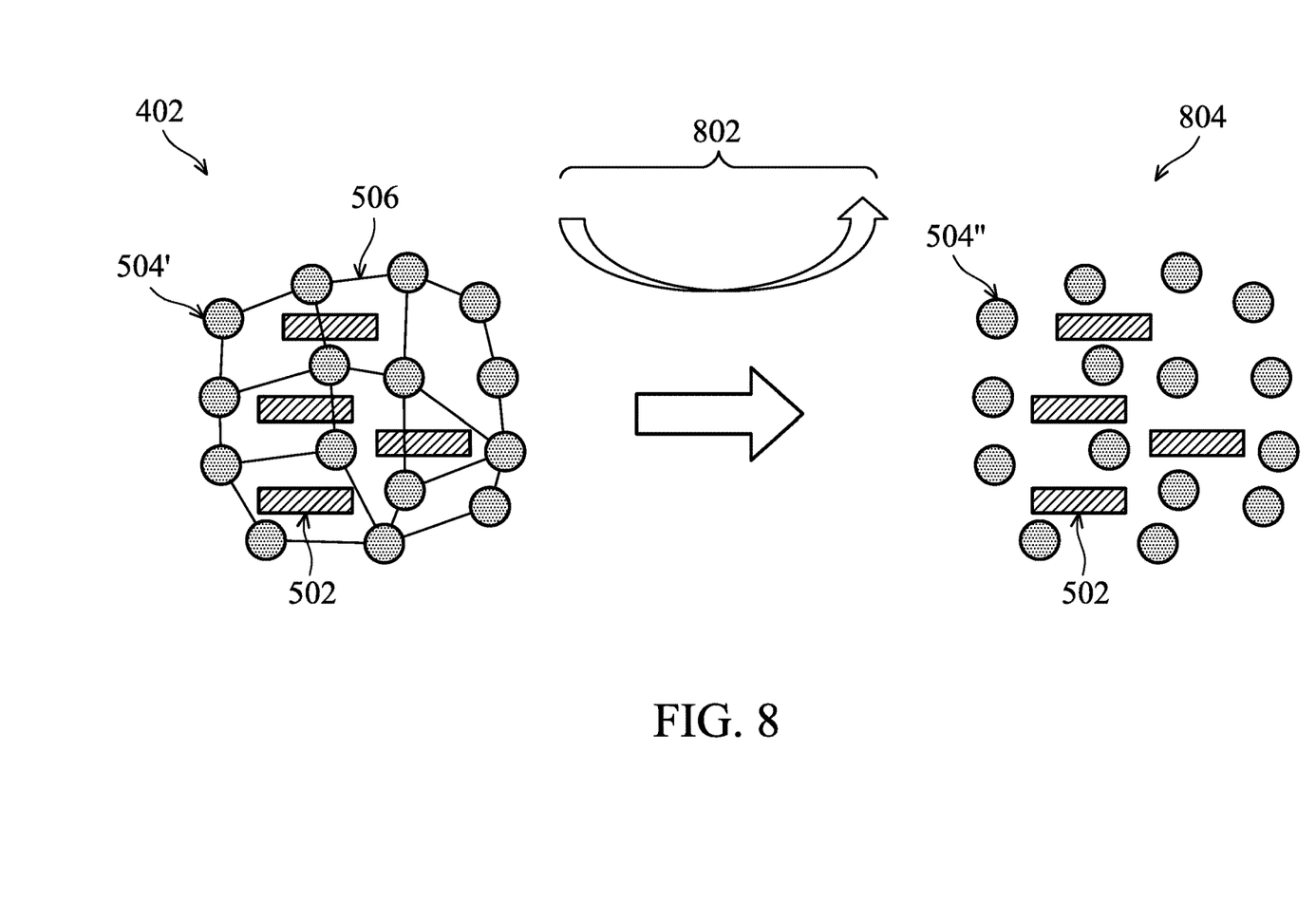
FIG. 8 shows examples of a material composition, after a cross-linking step has been applied and after a decomposing step is applied, in accordance with some embodiments.

Referring to the illustration of FIG. 8, a decomposing process 802 is applied to the primer material 402, which includes the surface interaction enhancement component 502 and the cross-linkable component 504' where the cross-linkable component 504 is cross-linked as illustrated by the bonds 506. After application of the decomposing process 802, the primer material 402 is modified to provide primer material 804. The primer material 804 includes the surface interaction enhancement component 502 and the cross-linkable component 504" where the cross-linkable component 504" after de-cross-linking—i.e., ionic/covalently bonded to molecules of the cross-linkable component 504' are broken to provide component 504". The primer material 804 may be soluble in a solvent that the cross-linked component—primer material 402, was not soluble within.

Figure 7A:
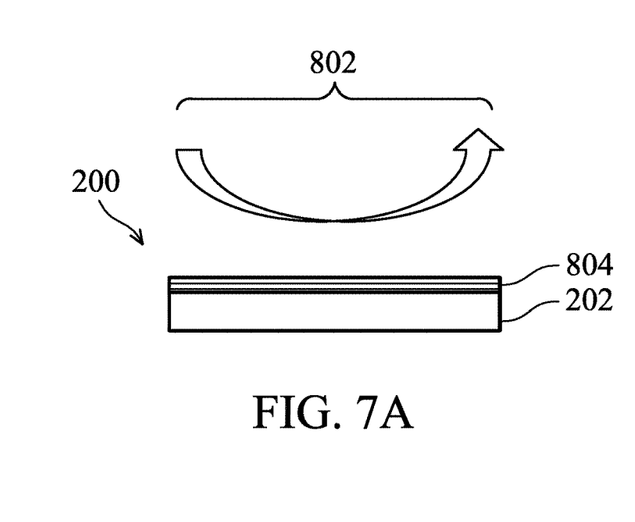
Figure 7B:
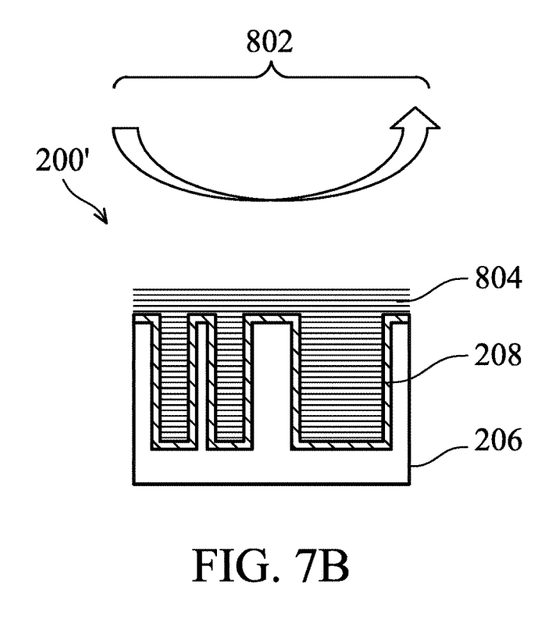

Referring to the example of FIGS. 7A and 7B, illustrated is the decomposing process 802 being applied to the primer material 402 to form primer material 804 (see FIG. 8), which is now de-cross-linked.

As a result of the de-cross-linking provided by the decomposing process of block 114, the primer material has a composition that may once again become solvent soluble. In some embodiments, the de-cross-linked primer material may be removed by a basic or acidic treatment, while leaving any underlying substrate layer of material undamaged. The basic or acidic treatment may be the same treatment as providing the de-crosslinking, or may be a separate solution.

Once the primer material has been de-cross linked, in some embodiments, a solution is applied to remove the layer. In some cases, the solution includes acetone, acetate, ethyl, methyl, water, a combination thereof, or other suitable organic solvent. The composition of the solution is selected such that it includes a solution that the de-cross-linked primer material is suitably soluble within. The solution may be applied in a wet etching process. As a result of the de-cross-linking and solubility change, the solution may be effective in removing the primer material without damage to an underlying layer.

As discussed above, additional steps may also be provided before, during, and after the method 100, and some steps described can be replaced, eliminated, or moved before or after other steps for additional embodiments of the method. For example, in an embodiment, the substrate 202 and/or feature 206 is a semiconductor substrate having fins and the method 100 proceeds to forming fin field effect transistor (FinFET) devices. The various embodiments described herein offer several advantages over the existing art. It will be understood that not all advantages have been necessarily discussed herein, no particular advantage is required for all embodiments, and other embodiments may offer different advantages. As one example, embodiments discussed herein include methods to improve the application of primer material, suitable control of thickness, easy removal of primer material, limiting undesired consumption of primer material, and/or suitable treatment of a surface and/or protection of an underlying layer during subsequent processes. For example, various embodiments provide an alternative primer material composition and related method in which a primer material may include a cross-linkable component that allows for forming a cross-linked primer material. In some embodiments, the cross-linked primer material may be subsequently de-cross-linked. After and/or during such de-cross-linking, the previously insoluble cross-linked primer material composition becomes soluble. As a result, the de-cross-linked primer material may be readily removed (e.g., by a solvent) without damaging an underlying substrate layer. Thus, embodiments of the present disclosure serve to overcome various shortcomings of treatment material compositions and methods.

Figure 9:
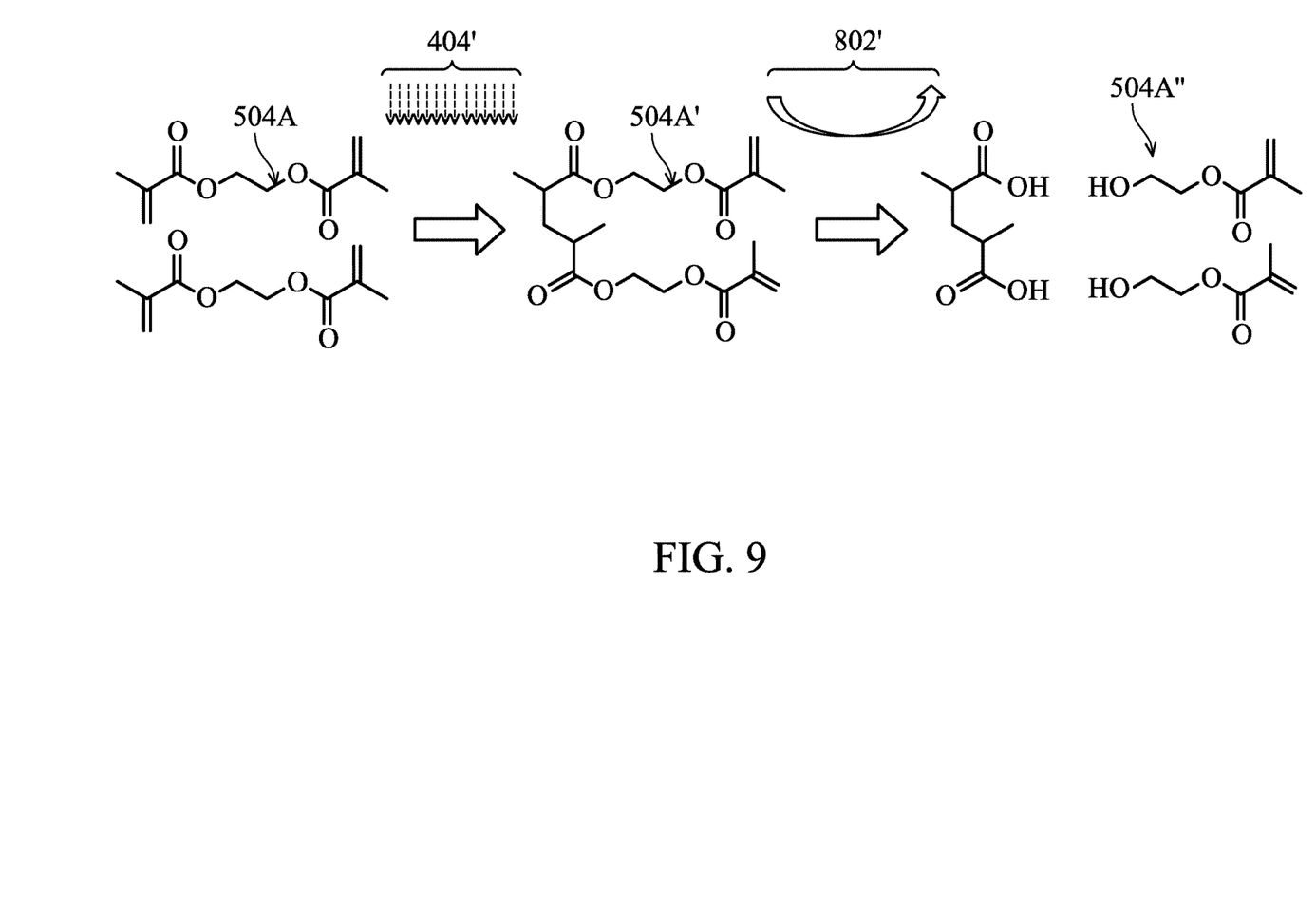
FIG. 9 shows an example of an exemplary cross-linkable component of a primer material according to one or more aspects of the present disclosure.

Illustrated in FIG. 9 is a specific example of the cross-linkable component 504 as provided in various steps of the method 100. The embodiment of FIG. 9 illustrates a cross-linkable component of a primer material where the cross-linkable component is an ester based material. It is noted that an "A" is appended to the similarly annotated cross-linkable component illustrated above including at FIGS. 5 and 8, again this FIG. 9 illustrating an exemplary embodiment. In the primer material as deposited, the cross-linkable component 504A is without cross-linking. This is similar to as discussed above with reference to blocks 106 and 108 of the method 100 of FIG. 1. After application of the cross-linking process 404' (an embodiment of the cross-linking process 404, discussed above), the cross-linkable component is modified to form compound 504A', which is self-cross-linked. (The cross-linked, cross-linkable component 504A' may be provided in the primer material 402 as discussed above.) In an embodiment, the cross-linking process 404' is a thermal bake. In an embodiment, the cross-linking process 404' is a UV curing process. As illustrated by element 504A', the cross-linkable material has underwent cross linking reaction and forms a network film. As discussed above, the cross-linked material 504A' is able to keep a surface interaction enhancement component within the network (e.g., surrounded) and protected from removal by subsequent processes.

After performing one or more processes typical of semiconductor fabrication, a decomposing process 802', which is an embodiment of the decomposing process 802 discussed above, may be performed upon the primer material including the cross-linked material 504A'. In an embodiment, the decomposing process 802' is an application of a basicity treatment for example, applying a basic solution in liquid form. After application of the decomposing process 802', the cross-linked material 504A' is de-cross-linked illustrated as de-cross linked component 504A". The component 504A" may be an embodiment of the component 504" above including, for example, being included in the primer material 804. After providing de-cross-linked material 504A", the primer material may be removed by a cleaning process such as introduction of a solvent within which the de-cross-linked material 504' is soluble. In some embodiments, the same solution provided by the decomposing process 802' also dissolves the primer material including de-cross linked component 504A". Thus, in some embodiments, in a single step the cross-linkable component is both de-cross-linked and also dissolved.

Thus, one of the embodiments of the present disclosure described a method comprising providing a semiconductor substrate. A primer material is deposited on the semiconductor substrate. The primer material includes a surface interaction enhancement component and a cross-linkable component. A cross-linking process is performed on the deposited primer material. The cross-linkable component self-cross-links in response to the cross-linking process to form a cross-linked primer material. At least one process is then performed on substrate having the cross-linked primer material (e.g., wet etch, dry etch, deposition of material, patterning materials and/or processes, etc.).

In another of the embodiments, discussed is a method that includes depositing a primer material on an exposed surface over a semiconductor substrate. The primer material includes a surface interaction enhancement component and a cross-linkable component. A self-cross-linking process of the cross-linkable component is initiated that includes a first molecule of the cross-linkable component bonding with a second molecule of the cross-linkable component primer material.

In yet another of the embodiments, discussed is a method of semiconductor device fabrication including providing a substrate having a plurality of trench features. A primer material is deposited filling the plurality of trench features. The primer material includes a nitrogen-comprising polymer component, and an ester-type component. One of an exposure to radiation or a thermal process is performed to form a network of cross-linked molecules of the ester-type component, wherein the network surrounds the nitrogen-comprising polymer component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   providing a substrate;
   depositing a primer material on the substrate, wherein the primer material includes:
      a surface interaction enhancement component, wherein the surface interaction enhancement component includes pyridine, and
      a cross-linkable component;
   performing a cross-linking process on the deposited primer material, wherein the cross-linkable component self-cross-links in response to the cross-linking process to form a cross-linked primer material; and
   performing at least one semiconductor device fabrication process on the substrate including the cross-linked primer material.

2. The method of claim 1, wherein the providing the substrate includes providing a trench opening and the depositing the primer material includes filling the trench opening with the primer material.

3. The method of claim 1, wherein the cross-linking process is a radiation treatment.

4. The method of claim 1, wherein the cross-linking process is a thermal bake.

5. The method of claim 1, wherein the providing the substrate includes providing a top surface with a first contact angle to a water droplet, and wherein the depositing the primer material includes providing a second contact angle to the water droplet different from the first contact angle, wherein the second contact angle is provided by the surface interaction enhancement component.

6. The method of claim 1, further comprising:
   after the performing at least one semiconductor device fabrication process, removing the cross-linked primer material.

7. The method of claim 6, wherein the removing includes:
   de-cross-linking the cross-linked primer material.

8. The method of claim 7, wherein the de-cross-linking includes at least one of a basicity treatment or an acid treatment.

9. The method of claim 7, wherein the de-cross-linking includes the basicity treatment of providing Tetramethylammonium hydroxide (TMAH) or KOH to the substrate.

10. The method of claim 1, wherein providing the substrate includes providing a metal containing surface and wherein the depositing the primer material forms an interface between the primer material and the metal containing surface.

11. A method of semiconductor device fabrication, comprising:
providing a first layer disposed on sidewalls of a trench, the first layer having an exposed surface;
depositing a primer material on the exposed surface, wherein the primer material includes:
a surface interaction enhancement component, and
a cross-linkable component; and
initiating a self-cross-linking process of the cross-linkable component, wherein the self-cross-linking process includes a first molecule of the cross-linkable component bonding with a second molecule of the cross-linkable component of the primer material.

12. The method of claim 11, wherein the surface interaction enhancement component changes a degree of hydrophobicity of the exposed surface.

13. The method of claim 11, further comprising:
after initiating the self-cross-linking process, initiating a de-cross-linking process, wherein the de-cross linking process breaks the bonding between the first and second molecules of the cross-linkable component.

14. The method of claim 13, wherein the initiating the de-cross-linking process includes applying one of an acid or a base.

15. The method of claim 14, wherein the applying the acid or the base removes the primer material from a semiconductor substrate including the trench.

16. The method of claim 11, wherein the first layer is an antirelective coating.

17. A method of semiconductor device fabrication, comprising:
providing a substrate having a plurality of trench features;
depositing a primer material filling the plurality of trench features, wherein the primer material includes:
a nitrogen-comprising polymer component, and
an ester-type component wherein in the ester-type component includes ethylene glycol dimethylacrylate (EGDMA); and
performing one of an exposure to radiation or a thermal process to form a network of cross-linked molecules of the ester-type component, wherein the network surrounds the nitrogen-comprising polymer component.

18. The method of claim 17, further comprising:
performing at least one of a wet etch or a dry etch process while the primer material having the network of cross-linked molecules fills the plurality of trench features.

19. The method of claim 18, further comprising:
after performing the at least one the wet etch or dry etch process, removing the primer material having the network of cross-linked molecules.

20. The method of claim 17, wherein an underlying layer is disposed on sidewalls of each of the plurality of trench features, wherein the primer material is disposed on the underlying layer.

* * * * *